US006616857B2

(12) United States Patent
Li et al.

(10) Patent No.: US 6,616,857 B2
(45) Date of Patent: Sep. 9, 2003

(54) C-AXIS ORIENTED LEAD GERMANATE FILM

(75) Inventors: Tingkai Li, Vancouver, WA (US); Fengyan Zhang, Vancouver, WA (US); Yoshi Ono, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 09/942,203

(22) Filed: Aug. 29, 2001

(65) Prior Publication Data

US 2002/0018904 A1 Feb. 14, 2002

Related U.S. Application Data

(62) Division of application No. 09/301,420, filed on Apr. 28, 1999, now Pat. No. 6,410,343.

(51) Int. Cl.$^7$ .................... H01B 1/08; B32B 33/00; C04B 35/00; C01G 17/00; C01G 21/00
(52) U.S. Cl. .................... 252/62.9 R; 252/62.9 PZ; 252/518.1; 252/520.3; 252/514; 428/641; 428/645; 428/670; 257/295; 257/412; 423/618; 501/22; 501/42
(58) Field of Search ................ 252/62.9 R; 423/89, 423/603, 618; 501/22, 42; 374/177; 377/101; 428/545, 548, 645, 641, 670; 365/145; 257/412, 295

(56) References Cited

U.S. PATENT DOCUMENTS 4,792,463 A * 12/1988 Okada et al. ............... 427/100

6,410,343 B1 * 6/2002 Li et al. .................... 438/239

FOREIGN PATENT DOCUMENTS

| JP | 05078128 | * | 3/1993 | ........... C01G/21/00 |
| JP | 07034241 | * | 2/1995 | ........... C23C/14/34 |
| JP | 08-277196 | * | 10/1996 | ........... C03B/29/22 |

OTHER PUBLICATIONS

Kato et al, "Preparation and properties of PGO thin films by the sol–gel process", J. Non–Crystalline Solids, 178, pp 333–339, (1994).*

* cited by examiner

Primary Examiner—Yogendra N. Gupta
Assistant Examiner—Kallambella Vijayakumar
(74) Attorney, Agent, or Firm—Matthew D. Rabdau; David C. Ripma; Scott C. Krieger

(57) ABSTRACT

A ferroelectric $Pb_5Ge_3O_{11}$ (PGO) thin film is provided with a metal organic vapor deposition (MOCVD) process and RTP (Rapid Thermal Process) annealing techniques. The PGO film is substantially crystallization with c-axis orientation at temperature between 450 and 650° C. The PGO film has an average grain size of about 0.5 microns, with a deviation in grain size uniformity of less than 10%. Good ferroelectric properties are obtained for a 150 nm thick film with Ir electrodes. The films also show fatigue-free characteristics: no fatigue was observed up to $1\times10^9$ switching cycles. The leakage currents increase with increasing applied voltage, and are about $3.6\times10^{-7}$ A/cm$_2$ at 100 kV/cm. The dielectric constant shows a behavior similar to most ferroelectric materials, with a maximum dielectric constant of about 45. These high quality MOCVD $Pb_5Ge_3O_{11}$ films can be used for high density single transistor ferroelectric memory applications because of the homogeneity of the PGO film grain size.

6 Claims, 7 Drawing Sheets

THE MICROSTRUCTURE OF POLYCRYSTALLINE
C-AXIS ORIENTED $Pb_5Ge_3O_{11}$ FILMS

X-RAY PATTERN OF POLYCRYSTALLINE
C-AXIS ORIENTED $Pb_5Ge_3O_{11}$
FILMS DEPOSITED AT 500°C

THE MICROSTRUCTURE OF POLYCRYSTALLINE
C-AXIS ORIENTED $Pb_5Ge_3O_{11}$ FILMS

2Pr AND 2Ec OF POLYCRYSTALLINE C-AXIS ORIENTED
$Pb_5Ge_3O_{11}$ FILMS VS THE FIRST ANNEALING TEMPERATURE

THE FATIGUE PROPERTIES OF POLYCRYSTALLINE
C-AXIS ORIENTED $Pb_5Ge_3O_{11}$ THIN FILMS

THE HYSTERESIS LOOPS OF POLYCRYSTALLINE C-AXIS
ORIENTED $Pb_5Ge_3O_{11}$ THIN FILMS BEFORE AND AFTER FATIGUE

THE LEAKAGE CURRENT OF POLYCRYSTALLINE
C-AXIS ORIENTED $Pb_5Ge_3O_{11}$ THIN FILMS

THE DIELECTRIC CONSTANT OF POLYCRYSTALLINE
C-AXIS ORIENTED $Pb_5Ge_3O_{11}$ THIN FILMS

C-AXIS ORIENTED LEAD GERMANATE FILM

CROSS REFERENCE TO RELATED APPLICATIONS

This application is a divisional of application Ser. No. 09/301,420, filed Apr. 28, 1999 now U.S. Pat. No. 6,410,343, entitled "C-Axis Oriented Lead Germanate Film And Deposition Method," invented by Tingkai Li et al.

BACKGROUND AND SUMMARY OF THE INVENTION

The present invention relates generally to the fabrication of ferroelectric memory devices and, more particularly, with a method to maximize the ferroelectric properties of Lead Germanium Oxide (PGO) thin films for ferroelectric memory applications, by orienting crystallization of the PGO film along the c-axis.

Ferroelectric thin films for use in electro-optics, pyroelectric, frequency agile electronics, and non-volatile memories have drawn much attention in recent years due to their bi-stable nature. Most of the studies on Ferroelectric Random Access Memories (FRAMs) have concentrated on the memory structure with one transistor and one capacitor. The capacitor is made by a thin ferroelectric film sandwiched between two conductive electrodes. The circuit configuration and read/write sequence of this type memory are similar to that of DRAMs except no data refreshing is necessary in FRAMs. The fatigue problem observed in ferroelectric capacitor, therefore, becomes one of the major obstacles that limit the realization of these memories on a commercial scale. Lead germanate ($Pb_5Ge_3O_{11}$) thin films exhibit excellent fatigue properties, so these PGO thin films are very attractive materials for FRAM device applications.

The non-perovekite uniaxial ferroelectric $Pb_5Ge_3O_{11}$, with polar direction parallel to the c-axis, belongs to the trigonal space group P3 at room temperature. This material transforms to the hexagonal, space group P6(=P3/m) paraelectric phase above the Curie temperature (Tc=178° C.). Since this uniaxial ferroelectric $Pb_5Ge_3O_{11}$ possesses only 180° domains, there are no ferroelastic effects that tend to reorient domains though 90° in order to relax the polarization. Interesting features of this material are the small dielectric constant and small remanent polarization, which are also suitable for ferroelectric non-volatile memory devices, especially for one transistor memory applications. $Pb_5Ge_3O_{11}$ also has some potential for thermal detector applications because of its pyroelectric and dielectric characteristics.

Another area of research in ferroelectric non-volatile memory is the deposition ferroelectric thin film directly onto the gate area of FET, to form a ferroelectric-gate controlled FET. Ferroelectric-gate controlled devices such as metal-ferroelectric-silicon (MFS) FET have been studied as early as 1950s. Various modified MFSFET structures have been proposed. For example, Metal-Ferroelectric-Insulator-Silicon (MFIS) FET, Metal-Ferroelectric-Metal-Silicon (MFMS) FET, and Metal-Ferroelectric-Metal-Oxide-Silicon (MFMOS) FET. In response to the requirements of one transistor memory applications, ferroelectric materials should have low dielectric constant and small remanent polarization. Therefore, ferroelectric $Pb_5Ge_3O_{11}$ thin films, which have a smaller remanent polarization of 4 $\mu C/cm^2$ and dielectric constant of about 50 in their bulk materials, have been sought.

The thin films of lead germanate were made in the past by thermal evaporation and flash evaporation (A. Mansingh and S. B. Krupanidhi, J. Appl. Phys. 51, 5408, 1980), dc reactive sputtering (H. Schmitt, H. E. Mueser, and R. Karthein, Ferroelectrics 56, 141, 1984), laser ablation (S. B. Krupanidhi, D. Roy. N. Maffei, and C. J. Peng, Proceedings of 3$^{rd}$ International Symp. on Integrated Ferroelectrics, 100, 1991), and sol-gel technique (J. J. Lee and S. K. Dey, Appl. Phys. Lett. 60, 2487, 1992).

Previously, single crystal $Pb_5Ge_3O_{11}$ have been reported, with spontaneous polarization and coercive field of 4 $\mu C/cm^2$ and 14 kV/cm, respectively, in the direction along the c-axis. These c-axis oriented $Pb_5Ge_3O_{11}$ thin films exhibit poor ferroelectric properties: lower polarization (2–3 $\mu C/cm^2$, higher coercive field (55–135 kV/cm ), and their hysteresis loops were not saturated and square. In order to switch the PGO ferroelectric domains, very high operation voltages are required, which precludes their use in the memory devices.

The PGO film of the present invention was developed meet the requirements of ferroelectric memory devices. The present invention concerns a pure c-axis oriented PGO thin films have a smaller Pr value, smaller dielectric constant and largest Ec value. Such a film is useful in making one transistor (1T) memory cells. In co-pending patent application Ser. No. 09/301,435, entitled "Multi-Phase Lead Germanate Film and Deposition Method", invented by Tingkai Li et al., filed on Apr. 28, 1999, a second phase of $Pb_3GeO_5$ is added to the $Pb_5Ge_3O_{11}$, increasing grain sizes without an increase in c-axis orientation. The resultant film had increased Pr values and dielectric constants, and decreased Ec values. Such a film is useful in microelectromechanical systems (MEMS), high speed multichip module (MCM), DRAM, and FeRAM applications.

In co-pending patent application Ser. No. 09/302,272, entitled "Epitaxially Grown Lead Germanate Film and Deposition Method", invented by Tingkai Li et al., filed on Apr. 28, 1999, issued on Feb. 20, 2001 as U.S. Pat. No. 6,190,925, an appropriate content of the second phase $Pb_3GeO_5$ is added to $Pb_5Ge_3O_{11}$, forming large grain sizes with extremely high c-axis orientation and completely epitaxial c-axis ferroelectric lead germanate film. As a result, high Pr and Ec values, as well as lower dielectric constant, is obtained. Such a film is useful in 1T, one transistor/one capacitor (1T/1C) FeRAM memory devices.

In co-pending patent application Ser. No. 09/301,434, entitled "Ferroelastic Lead Germanate Film and Deposition Method", invented by Tingkai Li et al., filed on Apr. 28, 1999, a CVD) $Pb_3GeO_5$ film is funned having improved ferroelastic properties useful in making MEM and MOM devices. The above-mentioned co-pending patent application are incorporated herein by reference.

It would be advantageous if a single phase PGO film could be developed with ferroelectric properties sufficient for use in non-volatile memories.

It would be advantageous if the ferroelectric properties of a single phase polycrystalline PGO film could be enhanced by crystallographic alignment. Further, it would be advantageous if the crystalline PGO film could be aligned primarily along the c-axis.

It would be advantageous if a PGO film could be formed having a small, homogeneous, grain size for use in high density non-volatile ferroelectric memories.

Accordingly, in a lead germanium oxide (PGO) film, a method has been provided for forming a polycrystalline PGO film, having a c-axis orientation, on a IC film in a reactor chamber. The method comprising the steps of:

a) mixing [Pb(thd)$_2$] and [Ge(ETO)$_4$] to form a PGO mixture having a molar ratio in the range of approximately 5:3;

b) dissolving the mixture of Step a) with a solvent of tetrahydrofuran, isopropanol, and tetraglyme in a molar ratio of approximately 8:2:1, respectively, to form a precursor solution having a concentration of approximately 0.1 to 0.3 moles of PGO mixture per liter of solvent;

c) using a precursor vaporizer, heating the precursor solution to a temperature in the range of approximately 130 to 180 degrees C., creating a precursor gas;

$c_1$) mixing the precursor gas in the chamber with an argon gas shroud flow in the range of approximately 1000 to 6000 standard cubic centimeters per minute (sccm), preheated to a temperature in the range of approximately 130 to 180 degrees C.;

$c_2$) introducing an oxygen flow to the chamber in the range of approximately 500 to 3000 sccm;

d) heating the wafer to a temperature in the range of approximately 450 to 500 degrees C., to decompose the precursor gas formed in Step c) on the wafer;

e) forming a PGO film, including a first phase of $Pb_5Ge_3O_{11}$ with a small, homogeneous, crystal grain size; and f) forming a c-axis crystallographic orientation of approximately 70%, or more, in the $Pb_5Ge_3O_{11}$ phase of the PGO film, and a grain size in the range of approximately 0.2 to 0.8 microns, whereby the ferroelectric properties of the PGO film are optimized.

In some aspects of the invention, Step f) includes the following sub-steps of:

$f_1$) simultaneously with the deposition if the PGO film in Step e), orienting the polycrystalline structure of the PGO film in a primarily c-axis orientation; and $f_2$) following Step e), annealing the PGO film formed in Step e) at a temperature in the range of approximately 450 to 550 degrees C. in an atmosphere selected from the group of oxygen and oxygen with Pb atmospheres, whereby the c-axis orientation of the polycrystalline PGO film is enhanced;

In some aspects of the invention, a ferroelectric device is formed with the PGO film of in Step e), and includes further steps, following Step $f_2$), of:

g) forming a conductive electrode underlying the PGO film formed in Step e); and h) annealing the PGO film formed in Step e) at a temperature in the range of approximately 450 to 550 degrees C. in an atmosphere selected from the group of oxygen and oxygen with Pb atmospheres, whereby the interface between the PGO film, formed in Step e), and the electrode formed in Step g), is improved.

Steps $f_2$) and h) include using a rapid thermal annealing (RTA) process to anneal the PGO film having a thermal ramp-up rate in the range of approximately 10 to 200 degrees C. per second, and a time duration of approximately 10 minutes.

A lead germanium oxide (PGO) film having improved ferroelectric properties is also provided. The PGO film comprises a first phase of polycrystalline $Pb_5Ge_3O_{11}$, where $Pb_5Ge_{3O11}$ phase has primarily a c-axis crystallographic orientation. The c-axis orientation promotes ferroelectric film properties. In some aspects of the invention, approximately 70%, or more, of the $Pb_5Ge_3O_{11}$ film has the c-axis orientation. The polycrystalline $Pb_5Ge_3O_{11}$ film also includes crystal grains having a grain size in the range of approximately 0.2 to 1.5 microns.

A capacitor having ferroelectric properties is also provided. The capacitor comprises a first conductive electrode, a PGO film including a polycrystalline $Pb_5Ge_3O_{11}$ phase with a primarily c-axis crystallographic orientation over the first electrode, and a second conductive electrode overlying the PGO film. The capacitor has a 2Pr of approximately 3.8 microcoulombs per centimeter squared ($uC/cm^2$) and a 2Ec of approximately 93 kilovolts per centimeter (kV/cm) at an applied voltage of 8 volts.

BRIEF DESCRIPTIONS OF THE DRAWINGS

DETAILED DESCRIPTION OF THE PREFERRED EMBODIMENT

The formation of PGO film through chemical vapor deposition (CVD) offers the advantages of excellent film uniformity, compositional control, high film densities, high deposition rates, excellent step coverage and amenability to large scale processing. The excellent film step coverage offered by CVD has not been equaled, to date, by any other technique. The purity, controllability, and precision demonstrated by CVD are competitive with molecular beam epitaxy (MBE). More importantly, novel structures can be easily and precisely grown. MOCVD is capable of producing an entire class of devices, which utilize either ultra-thin layers, or atomically sharp interfaces.

The ferroelectric $Pb_5Ge_3O_{11}$ thin films of the present invention were prepared on Ir or Pt coated Si wafers by metal organic vapor deposition (MOCVD) and RTP(Rapid Thermal Process) annealing techniques. The films are specular and crack free, and show complete crystallization with c-axis orientation at temperature between 450 and 550° C. Good ferroelectric properties are obtained for a 150 nm thick film with Ir electrodes: 2Pr and 2Ec are about 3.8 $\mu C/cm^2$ and 93 kV/cm, respectively. The films also show fatigue-free characteristics: no fatigue is observed after $1\times10^9$ switching cycles. Leakage currents increase with increased voltage, and are about $3.6\times10^7$ $A/cm^2$ at 100 kV/cm. The dielectric constant shows a behavior similar to most ferroelectric materials, where the dielectric constant changes with respect to an applied voltage. The maximum dielectric constant is about 30 to 50. These high quality MOCVD $Pb_5Ge_3O_{11}$ films can be used for applications of single transistor ferroelectric memory devices.

The present invention is a lead germanium oxide (PGO) film having improved ferroelectric properties comprising a first phase of polycrystalline $Pb_5Ge_3O_{11}$. The $Pb_5Ge_3O_{11}$ phase has primarily a c-axis crystallographic orientation, whereby the c-axis orientation promotes ferroelectric film properties. In some aspects of the invention, approximately 70%, or more, of the $Pb_5Ge_3O_{11}$ phase of the PGO film has the c-axis orientation. Further, the polycrystalline $Pb_5Ge_3O_{11}$ phase film includes crystal grains having a grain size in the range of approximately 0.2 to 0.8 microns. The polycrystalline PGO film includes small grain of a very uniform size. The deviation in uniformity of the grain size is less than approximately 10%. Although the grains are relatively small, their uniformity makes the present invention film ideal for high density (small) non-volatile memories.

Figure 1:
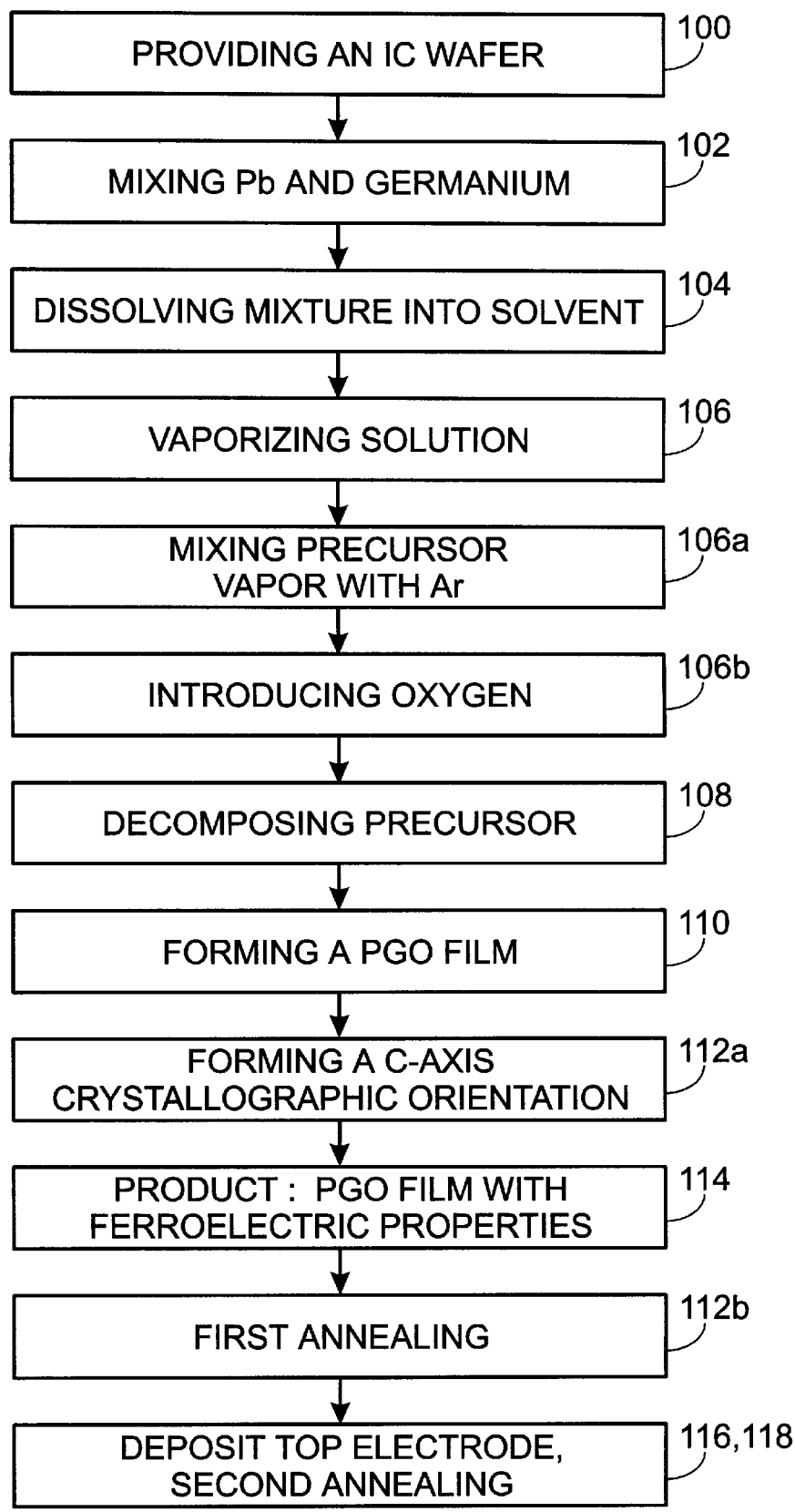
FIG. 1 illustrates steps in a method for forming a PGO film having a c-axis crystallographic orientation.

An EMCORE oxide MOCVD reactor with liquid delivery system was used for the growth of $Pb_5Ge_3O_{11}$ films. Such a system is shown in FIG. 1 in co-pending patent application Ser. No. 09/301,435, entitled "Multi-Phase Lead Germanate Film and Deposition Method", invented by Tingkai Li et al., filed on Apr. 28, 1999. The $Pb_5Ge_3O_{11}$ films were deposited on 6" Pt or Ir covered Si wafers using MOCVD processes. The precursors for PGO thin films listed in Table 1.

TABLE 1

The properties of precursors for PGO thin films

| Precursors | Formula | Vapor Pressure (mm Hg) | Decomposition Temperature(° C.) |
|---|---|---|---|
| $Pb(TMHD)_2$ | $Pb(C_{11}H_{19}O_2)_2$ | 180° C./0.05 | 325° C. |
| $Ge(ETO)_4$ | $Ge(C_2H_5O)_4$ | b.p. 185.5° C. | |

Liquid precursors such as germanium alkoxides, germanium halides, lead alkyls, and lead halides use a bubbler with a controlled temperature to generate precursor vapors. Solid precursors, such as lead B-diketonates, are dissolved in a solvent and use a liquid delivery system coupled with a flash vaporizer to generate precursor vapors. Table 2 is a list of PGO film precursors that are alternately used in some aspects of the present invention. Table 3 is a list of solvents that are alternately available for use in some aspects of the present invention.

TABLE 2

The properties of precursors for PGO films

| Precursor | Formula | Appearance at room temperature | Moisture stability | Vapor Pressure (mm Hg) | Decomposition Temp.(° C.) |
|---|---|---|---|---|---|
| $Ge(ETO)_4$ | $GeH_4$ $Ge_2H_6$ $Ge_3H_8$ $Ge(OC_2H_5)_4$ $GeCl_4$ $(C_2H_5)_2GeCl_2$ | colorless liquid | sensitive | 185° C. | |
| Pb Tetraphenyl | $Pb(C6H5)4$ | white powder | | 230° C./0.05 | 325° C. |
| $Pb(TMHD)_2$ | $Pb(C_{11}H_{19}O_2)_2$ $Pb(C_2H_5)_4$ | white powder | | 180° C./0.05 | 325° C. |

TABLE 3

The properties of solvents for PGO films

| Solvents | Formula | Boiling Temp. (° C.) |
|---|---|---|
| Tetrahydrofuran (THF) | $C_4H_8O$ | 65–67° C. |
| Iso-propanol | $C_3H_7OH$ | 97° C. |
| Tetraglyme | $C_{10}H_{22}O_5$ | 275° C. |
| Xylene | $C_6H_4(CH_3)_2$ | 137–144° C. |
| Toluene | $C_6H_5CH_3$ | 111° C. |
| Butyl ether | $[CH_3(CH_2)_3]_2O$ | 142–143° C. |
| Butyl acetate | $CH_3CO_2(CH_2)_3CH_3$ | 124–126° C. |
| 2-Ethyl-1-hexanol | $CH_3(CH_2)_3CH(C_2H_6)CH_2OH$ | 183–186° C. |

$[Pb(thd)_2]$ and $[Ge(ETO)_4]$ with a molar ratio of 5:3 were dissolved in a mixed solvent of tetrahydrofuran, isopropanol and tetraglyme in the molar ratio of 8:2:1. The precursor solutions have a concentration of 0.1 to 0.3 M/L of $Pb_5Ge_3O_{11}$. The solution was injected into a vaporizer (150° C.) by a pump at a rate of 0.1 ml/min to form precursor gases. The precursor gases were brought into the reactor using a preheated argon flow at 150–170° C. The deposition temperatures and pressure are 500° C. and 5–10 Torr separately. The shroud flow (Ar 4000 sccm) with oxygen (1000–2000 sccm) was led into the reactor. After deposition, the $Pb_5Ge_3O_{11}$ films were cooled down to room temperature in an oxygen atmosphere. For improved ferroelectric properties, the $Pb_5Ge_3O_{11}$ films were post-annealed before and after deposition of the top electrodes using RTP method. The post-annealing before deposition of top electrodes was defined as the first annealing, and the post-annealing after deposition of top electrodes was defined as the second annealing.

FIG. 1 illustrates steps in a method for forming a PGO film having a c-axis crystallographic orientation. Step 100 provides an integrated circuit (IC) film. The IC film material is selected from the group consisting of iridium and platinum. Typically, the above-mentioned materials coat silicon wafers. Step 102 mixes $[Pb(thd)_2]$ and $[Ge(ETO)_4]$ to form a PGO mixture having a molar ratio in the range of approximately 4.5:3 to 5.5:3. $[Pb(thd)_2]$, or Pb, is Bis(2,2,6,6-tetramethyl-3,5-heptanedionato)lead (II) and $[Ge(ETO)_4]$ is germanium (IV) ethoxide. The method of the invention will work even with molar ratios outside this range. In some aspects of the invention, Step 102 includes mixing the $[Pb(thd)_2]$ and $[Ge(ETO)_4]$ in a molar ratio of approximately 5:3. Pb ratios of greater than 5:3 are typically used when high precursor temperatures are used, see Step 106 below. Alternately, Pb ratios of lower than 5:3 are used when a Pb atmosphere is provided during deposition and annealment processes, see Steps 108–112 below.

Step 104 dissolves the mixture of Step 102 with a solvent of tetrahydrofuran, isopropanol, and tetraglyme to form a precursor solution. In some aspects of the invention, Step 104 includes the solvents tetrahydrofuran, isopropanol, and tetraglyme being in a molar ratio of approximately 8:2:1, respectively. Alternately, tetrahydrofuran is replaced with butyl ether. Step 104 includes forming a precursor solution having a concentration of approximately 0.1 to 0.3 moles of PGO mixture per liter of solvent. See Table 3 above for other solvent alternatives.

Step 106, from the solution formed in Step 104, creates a precursor gas. When Step 100 provides a precursor vaporizer, Step 106 includes using the precursor vaporizer to heat the precursor solution to a temperature in the range of approximately 130 to 180 degrees C., whereby the precursor gas is formed. As mentioned above, a wider range of vaporizer temperatures is possible by adjusting the molar ratio of the lead and germanium compounds in Step 102. In one preferred embodiment, the precursor solution is heated at approximately 150 degrees C. A typical reactor is equipped with a personal identifier (PID) controlled heating systems for precursor gas and carrier gas lines, exhaust lines, gas flow flange and reactor wall. The temperatures of gas flow flange and reactor wall are controlled to avoid the decomposition or condensation of oxide precursors Step 108 decomposes the precursor gas formed in Step 106 on the wafer. Although a larger range of temperatures is possible, Step 108 includes heating the wafer to a temperature in the range of approximately 450 to 500 degrees C., whereby the deposited film has a primarily c-axis crystallographic orientation.

Step 110 forms a PGO film, including a first phase of $Pb_5Ge_3O_{11}$. Step 112 forms a primarily c-axis crystallographic orientation in the $Pb_5Ge_3O_{11}$ phase of the PGO film. Typically, a film is considered to have a crystallographic orientation when crystal orientation along one axis, such as the c-axis, dominates over the other two axes, such as the a and b axes. In any event, a film has a specific crystallographic orientation when more than 50% of the crystals are aligned along one of the axes. In one aspect of the invention, Step 112 includes forming a polycrystalline $Pb_5Ge_3O_{11}$ phase having a c-axis orientation of approximately 70%, or more. Step 112 also includes the $Pb_5Ge_3O_{11}$ first phase having a grain size in the range of approximately 0.2 to 0.8 microns. A grain size of approximately 0.3 microns is preferred in some aspects of the invention. Further, Step 112 includes the polycrystalline $Pb_5Ge_3O_{11}$ phase film crystals having a uniform, or homogeneous, grain size. The deviation in crystal size uniformity is less than approximately 10%. Step 114 is a product, where the ferroelectric properties of the PGO film are optimized.

In some aspects of the invention, Step 100 provides a liquid pump. Then a further step follows Step 104, and precedes Step 106. Step 104a (not shown) uses the liquid pump to introduce the precursor solution of Step 104 to the precursor vaporizer in Step 106 at a rate in the range of approximately 0.1 to 0.5 milliliters per minute (ml/min).

In some aspects of the invention, the IC film is located in a reactor, or vacuum chamber, and further steps follow Step 106. Step 106a mixes the precursor gas in the reactor with an argon gas shroud flow in the range of approximately 1000 to 6000 standard cubic centimeters per minute (sccm), preheated to a temperature in the range of approximately 130 to 180 degrees C. Wider ranges of shroud flow and temperature are also possible. Step 106b introduces an oxygen flow to the chamber in the range of approximately 500 to 3000 sccm, whereby a lead-germanium oxide with a c-axis orientation is promoted. The oxygen atmosphere alternately includes pure $O_2$, or $N_2O$. Step 100 provides that the IC wafer is located on a wafer chuck in the reactor. Then, Steps 106a and 106b include establishing a precursor vapor pressure in the range of approximately 30 to 50 torr (T), and Step 108 includes establishing a chamber pressure in the range of approximately 5 to 10 T. A typical reactor system utilizes separate line and gas curtain flows for oxygen or reactants to inlet oxygen or reactants close to the surface of substrates to avoid the prereaction in gas phase before deposition of PGO film on the surface of substrates. The oxygen and reactant distributions for large area substrates are controlled by multi-lines and mass flow controllers.

Step 112 includes sub-steps. Step 112a simultaneously with the deposition if the PGO film in Step 110, orients the polycrystalline structure of the PGO film in a primarily c-axis orientation. Step 112b, following Step 110, anneals the PGO film formed in Step 110 at a temperature in the range of approximately 450 to 550 degrees C. in an atmosphere selected from the group of oxygen and oxygen with Pb atmospheres, whereby the c-axis orientation of the polycrystalline PGO film is enhanced. Alternately, wider deposition temperatures are used when by appropriate compensation in the RTP temperatures and processes.

In some aspects of the invention a ferroelectric device is formed with the PGO film of in Step 110. That is, the PGO film is deposited on a conductive electrode. Then, further steps follow Step 112b. Step 116 forms a conductive electrode overlying the PGO film formed in Step 110. Step 118 anneals the PGO film formed in Step 110 at a temperature in the range of approximately 450 to 550 degrees C. in an atmosphere selected from the group of oxygen and oxygen with Pb atmospheres. The interface between the PGO film, formed in Step 110, and the electrode formed in Step 116, is improved.

Steps 112b and 118 include the oxygen being introduced at a partial pressure greater than approximately 10%. The optimum oxygen partial pressure is from 20 to 100%. In some aspects of the invention, Steps 112b and 118 include using an annealing method selected from the group consisting of furnace annealing and rapid thermal annealing (RTA) at a thermal ramp-up rate in the range of approximately 10 to 200 degrees C. per second, and a time duration of approximately 10 to 1800 seconds. Longer annealing times are also useful.

Figure 2:
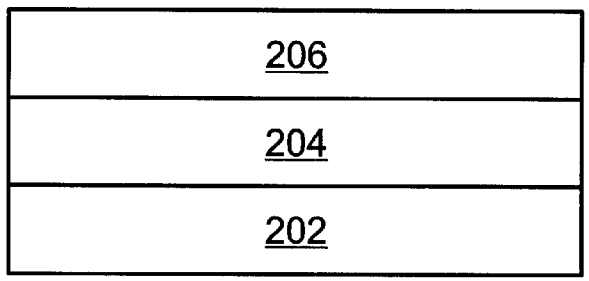
FIG. 2 illustrates a capacitor, using the present invention PGO film, having ferroelectric properties.
Figure 6:
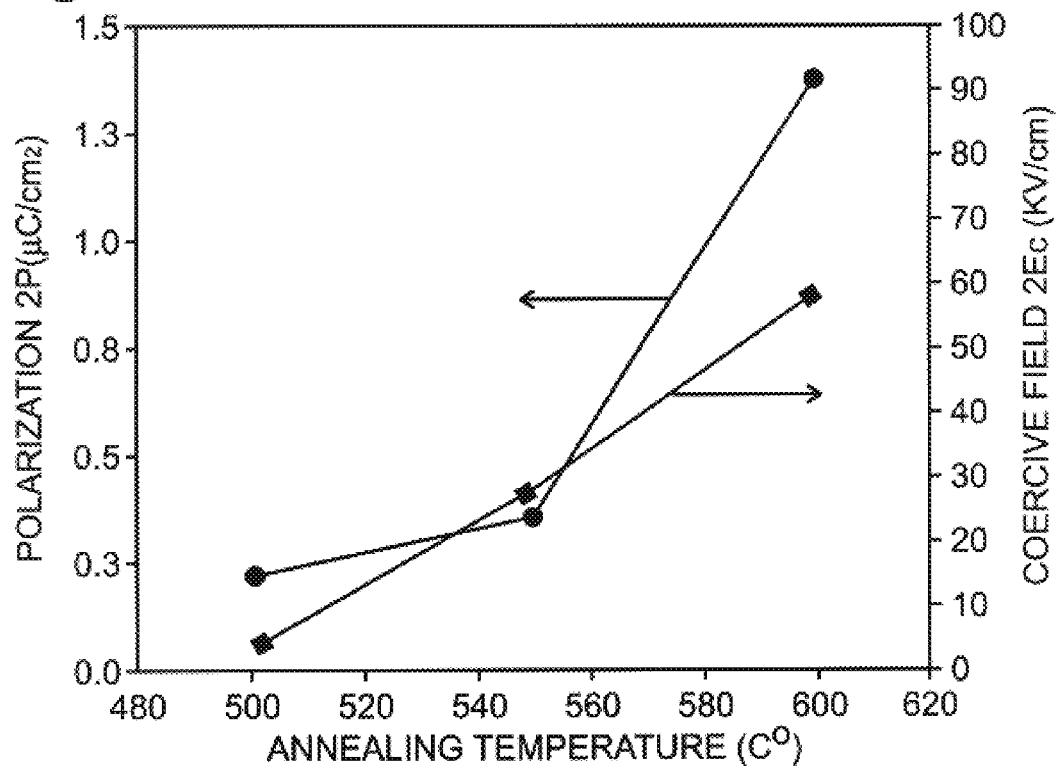
FIGS. 5 and 6 illustrate the Pr and Ec properties of the present invention PGO film.
Figure 5:
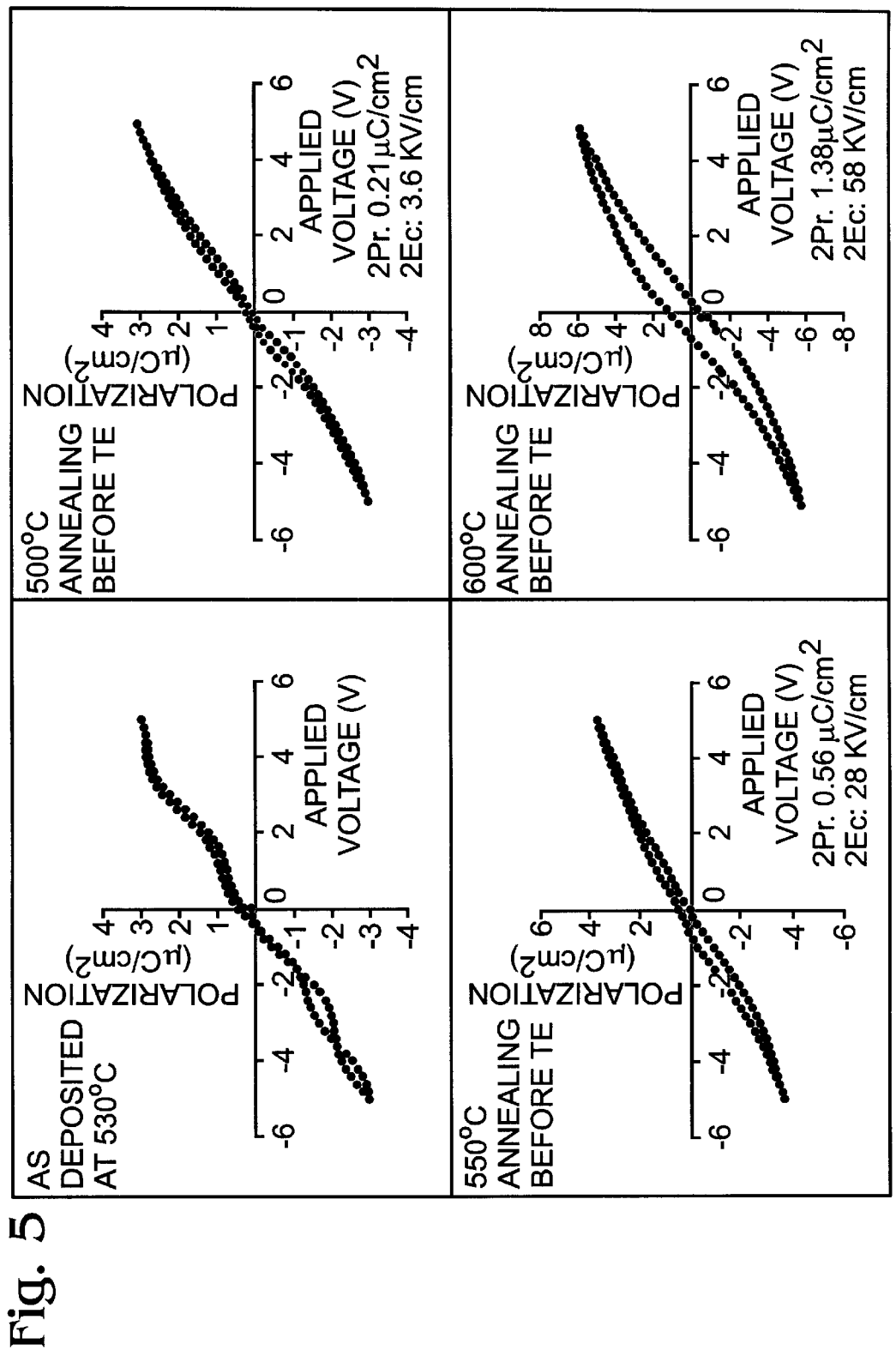
Figure 7:
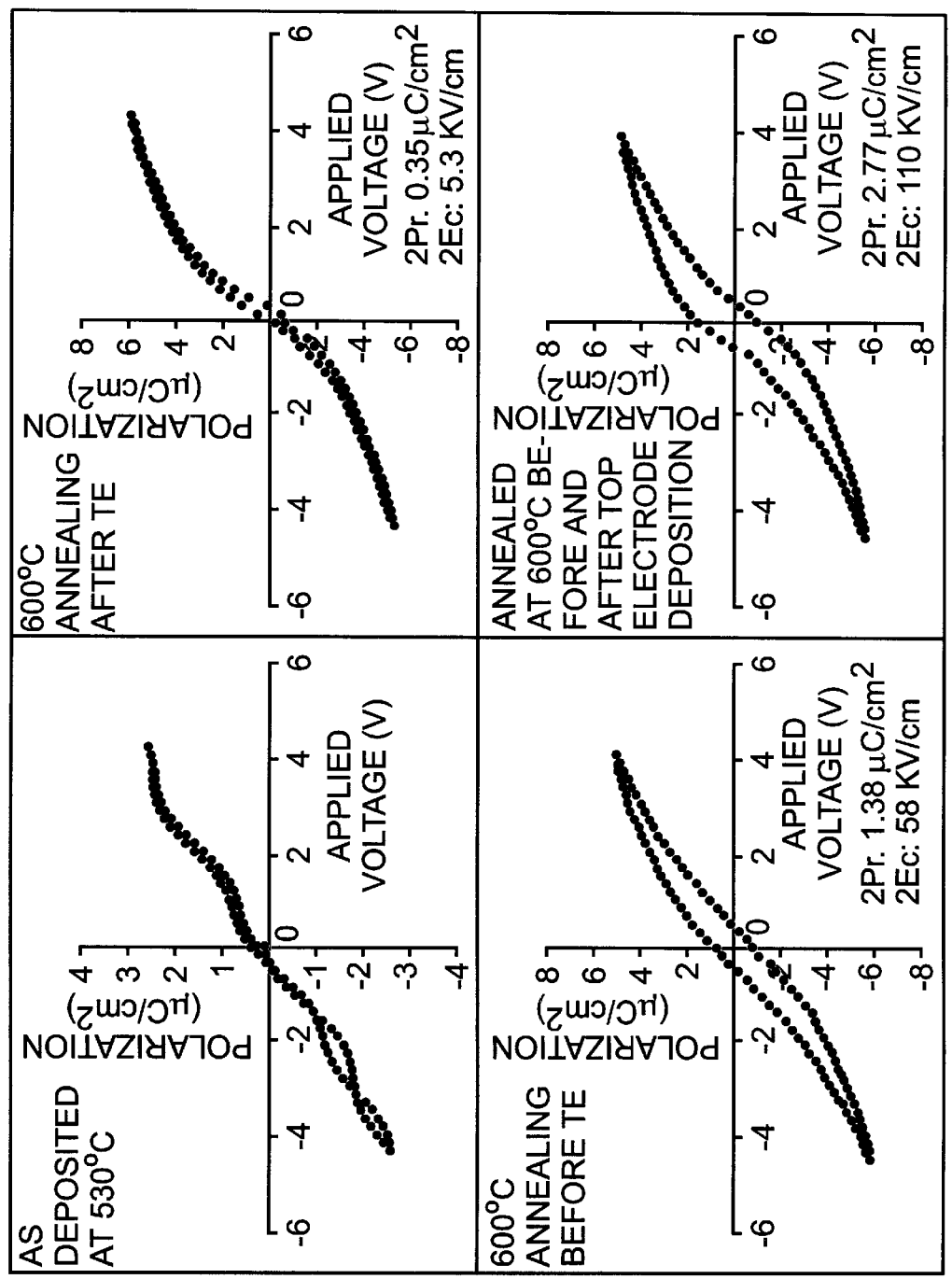
FIG. 7 shows the effect of post-annealing on the ferroelectric properties of $Pb_5Ge_3O_{11}$ film of the present invention.

FIG. 2 illustrates a capacitor, using the present invention PGO film, having ferroelectric properties. Capacitor 200 comprises a first conductive electrode 202, a PGO film 204 including a polycrystalline $Pb_5Ge_3O_{11}$ phase with a primarily c-axis crystallographic orientation overlying first electrode 202, and a second conductive electrode 206 overlying PGO film 204, whereby a PGO film capacitor is formed. The deviation in grain size uniformity of PGO film 204 is less than approximately 10%. As shown in FIGS. 5-7 and discussed below, capacitor 200 has ferroelectric properties which include polarization (Pr) and coercive field (Ec). The 2Pr is approximately 3.8 microcoulombs per centimeter squared ($uC/cm^2$) and the 2Ec is approximately 93 kilovolts per centimeter (kV/cm) at an applied voltage of 8 volts.

Figure 8:
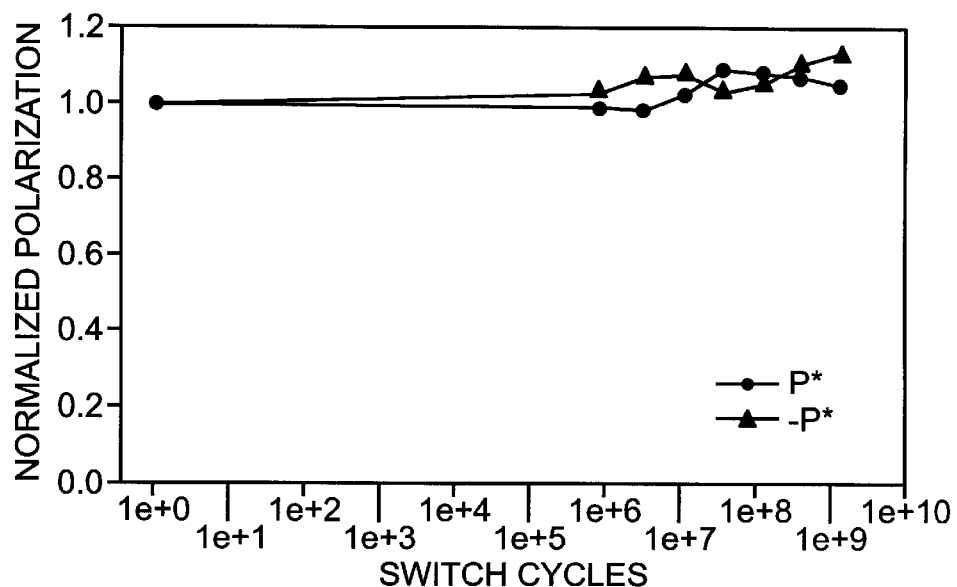
FIG. 8 illustrates the fatigue properties of the $Pb_5Ge_3O_{11}$ thin film of the present invention on an Ir substrate.

Capacitor 200 has ferroelectric properties which include a dielectric constant in the range of approximately 30 to 50 (FIG. 11), approximately a 95 to 99% polarization (Pr) after $1 \times 10^9$ cycles of polarization switching (FIG. 8).

The basic composition, phase, and ferroelectric and electrical properties of the $Pb_5Ge_3O_{11}$ films have been measured, and some preliminary data is available. The compositions of the Pb5Ge3O$_{11}$ films were analyzed by using energy dispersion X-ray analysis (EDX). The phases of the films were identified using x-ray diffraction. The thickness and surface morphologies of the films on Ir/Ti/SiO$_2$/Si substrates were investigated by Scanning Electronic Microscope. The leakage currents and dielectric constants of the films were measured using HP4155-6 precision semiconductor parameter analyzer and Keithley 182 CV analyzer respectively. The ferroelectric properties of the films were measured by a standardized RT66A tester.

The films were deposited at temperature about 450–500° C. As-deposited films were specular, crack-free, and adhered well on the substrates. These films also showed very smooth surfaces as viewed by means of both optical microscopy and scanning electron microscopy. The film growth rates were typically in the range of 2–5 nm/min.

Figure 3:
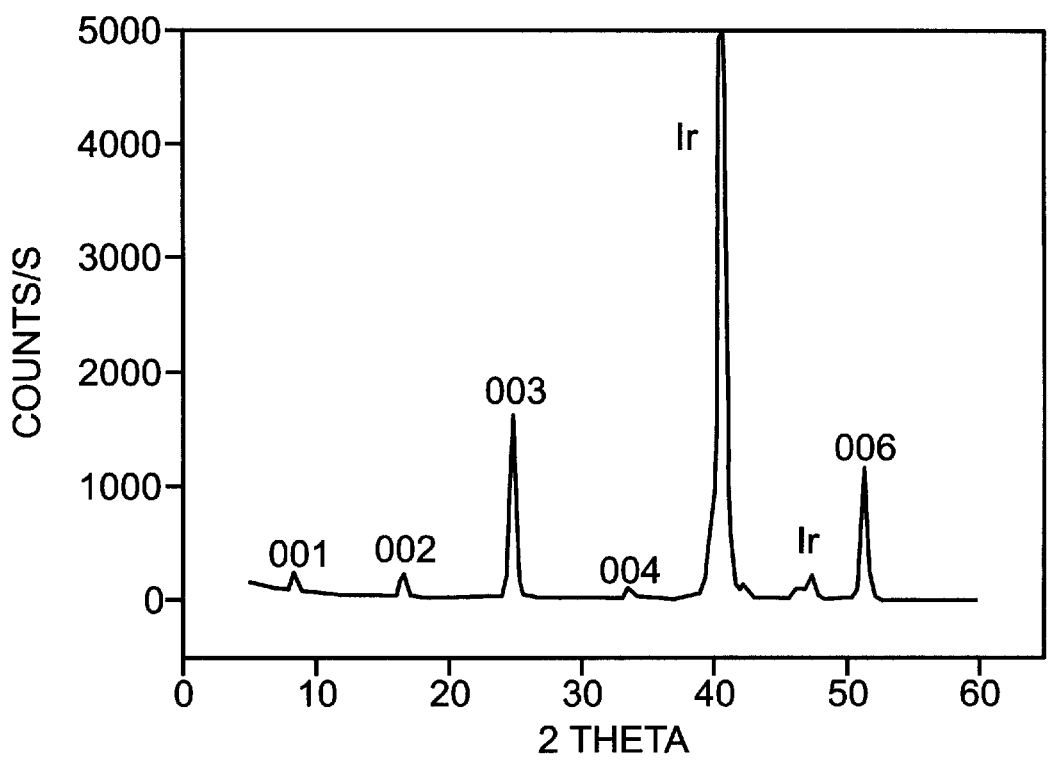
FIG. 3 is an X-ray pattern of the $Pb_5Ge_3O_{11}$ film of the present invention deposited at 500° C.

FIG. 3 is an X-ray pattern of the $Pb_5Ge_3O_{11}$ film of the present invention deposited at 500° C. The composition and X-ray analysis confirm the formation of polycrystalline c-axis oriented $Pb_5Ge3O_{11}$ films. Very sharp (001), (002), (003), (004), (005), and (006) peaks are observed, which indicate very well-crystallized $Pb_5Ge_3O_{11}$ film with preferred c-axis orientation. A small second phase $Pb_3GeO_5$ is also found from the X-ray pattern. For the surface morphology, the films appeared uniformly distributed fine grains and crack-free under SEM examinations.

Figure 4:
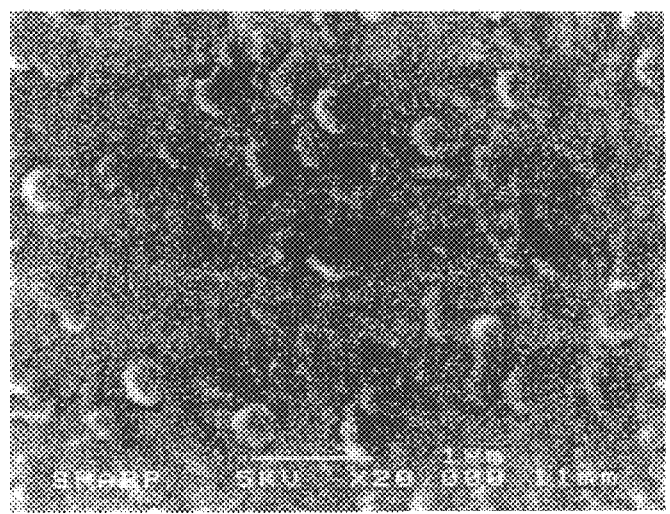
FIG. 4 is a scanning electron microscope (SEM) micrograph of the PGO film of the present invention.

FIG. 4 is a scanning electron microscope (SEM) micrograph of the PGO film of the present invention. The average grain size of the films is shown to be about 0.3 $\mu$m. The PGO film thickness is measured to be about 150 nanometers (nm).

FIGS. 5 and 6 illustrate the Pr and Ec properties of the present invention PGO film. The as-deposited $Pb_5Ge_3O_{11}$ films showed relatively poor ferroelectric properties. After the RTP annealing at 500° C. for 10 minutes, the $Pb_5Ge_3O_{11}$ films exhibited some ferroelectric properties with very small remanent polarization (Pr) and coercive field (Ec). With increased annealing temperatures, Pr and Ec increase. For annealing temperatures greater than 6500° C., the PGO thin films begin to break down.

FIG. 7 shows the effect of post-annealing on the ferroelectric properties of $Pb_5Ge_3O_{11}$ film of the present invention. Because the adhesion and interface properties between top electrodes and $Pb_5Ge_3O_{11}$ films are improved by post-annealing, the hysteresis loops of the $Pb_5Ge_3O_{11}$ films are well saturated and symmetrical at an applied voltage over 5 V. The 150 nm thick $Pb_5Ge_3O_{11}$ thin films show good ferroelectric properties with 2Pr 3.8 $\mu C/cm^2$, and 2Ec 93 kV/cm at an applied voltage 8V.

FIG. 8 illustrates the fatigue properties of the $Pb_5Ge_3O_{11}$ thin film of the present invention on an Ir substrate. The fatigue properties of the $Pb_5Ge_3O_{11}$ thin film were measured at 5V of 1MHz bipolar square wave. The film shows no fatigue after the sample was switched up to $1\times10^9$ cycles.

Figure 9:
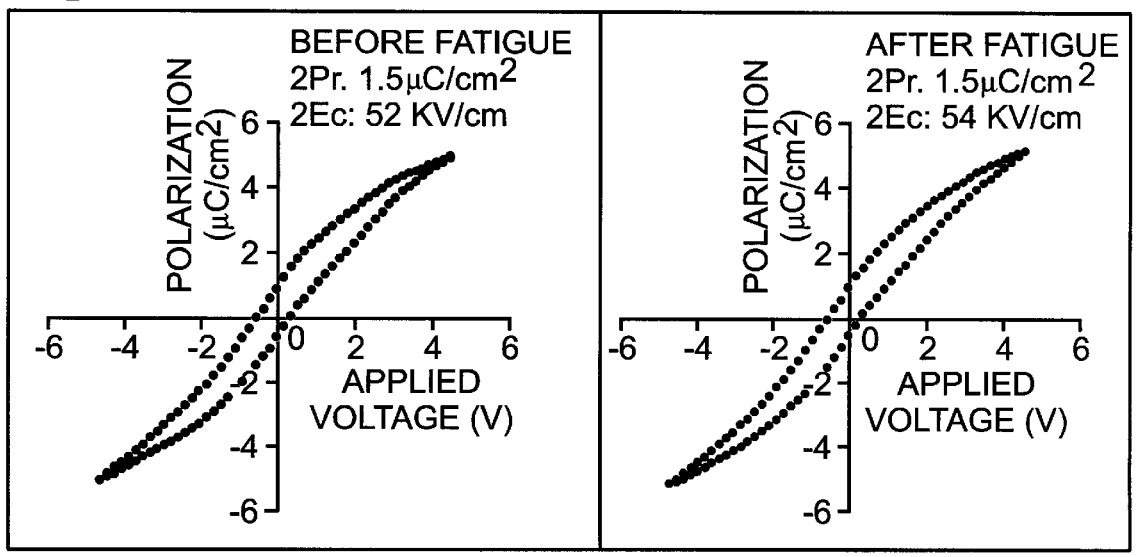
FIG. 9 illustrates hysteresis loops of capacitors made from the present invention PGO before and after fatigue testing.

FIG. 9 illustrates hysteresis loops of capacitors made from the present invention PGO before and after fatigue testing. The remanent polarization (2Pr) and coercive field (2Ec) of the films were 1.47 $\mu C/cm^2$ and 52 kV/cm before fatigue test, and 1.49 $\mu C/cm^2$ and 54 kV/cm after fatigue test respectively. It is believed that the superior fatigue properties of the PGO films are due to the PGO lattice structure.

PGO material has large polarization along the C axis, but little or no polarization along the a or b-axis. Thus, most of the domain configuration is the 180° domain. For this reason, the PGO has excellent fatigue properties, similar to bi-layer oxides.

Figure 10:
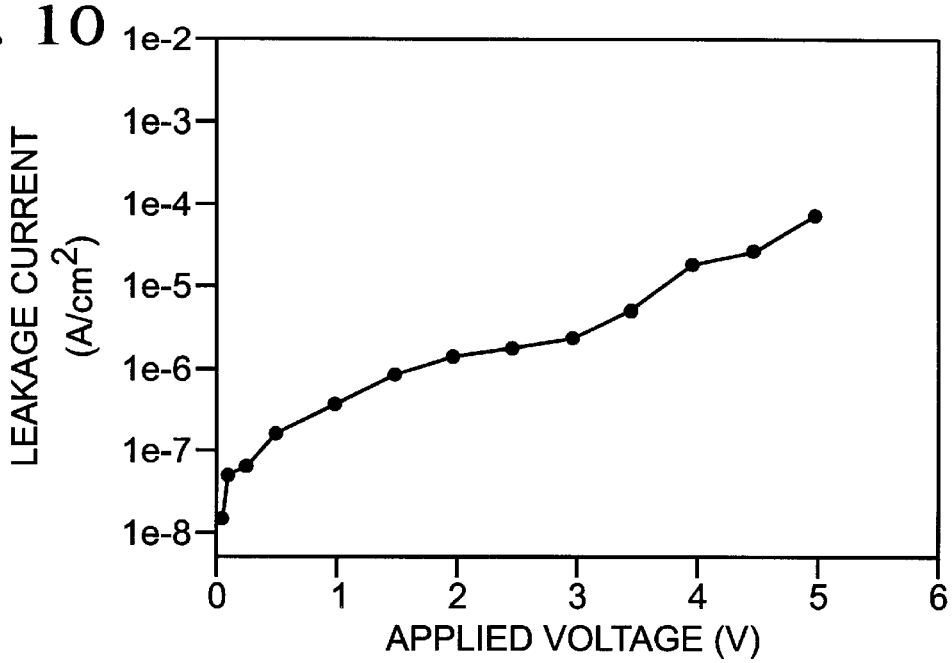
FIG. 10 illustrates the leakage current of a capacitor made from the present invention PGO film.

FIG. 10 illustrates the leakage current of a capacitor made from the present invention PGO film. Low leakage current density is an important consideration for memory device applications. FIG. 10 shows the I–V curve of a 150 nm thick MOCVD PGO film. Excellent I–V characteristics are observed. The leakage current density of the $Pb_5Ge_3O_{11}$ thin films increases with increased application voltage, and was found about $3.6\times10^7$ A/cm$^2$ at 100 KV/cm.

Figure 11:
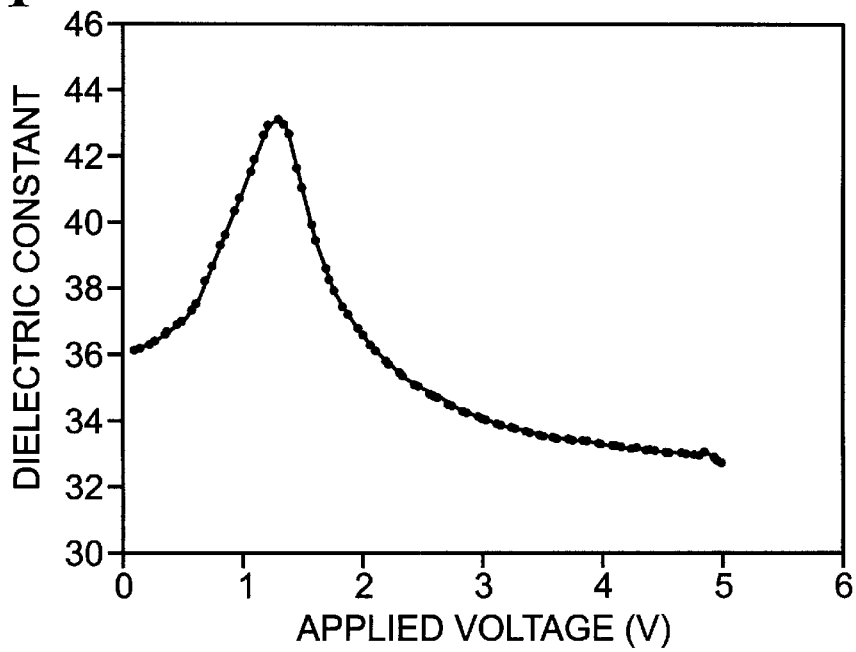
FIG. 11 illustrates the dielectric constant of the present invention PGO film.

FIG. 11 illustrates the dielectric constant of the present invention PGO film. The dielectric constant is also another important issue for memory device, especially for one transistor memory applications. The dielectric constant of the present invention $Pb_5Ge_3O_{11}$ thin films shows a behavior similar to most ferroelectric materials, where the dielectric constant changes with respect to an applied voltage. The maximum dielectric constant of the present invention $Pb_5Ge_3O_{11}$ thin films is approximately 45.

In summary, the c-axis oriented $Pb_5Ge_3O_{11}$ films were reproducibly fabricated on Pt or Ir covered Si substrates by MOCVD and RTP techniques. The polycrystalline c-axis oriented PGO films showed a uniform microstructure with a smaller grain size around 0.3$\mu$. The thin films also have a smaller polarization, smaller dielectric constant and lager coercive field, which meet the requirements for ferroelectric non-volatile memory devices, especially one-transistor memory applications. Other variations and embodiments of the present invention will occur to those skilled in the art.

What is claimed is:

1. A lead germanium oxide (PGO) film having improved ferroelectric properties comprising:

a polycrystalline $Pb_5Ge_3O_{11}$ phase film overlying an iridium metal layer, wherein the $Pb_5Ge_3O_{11}$ phase film includes crystal grains having a grain size in the range of approximately 0.2 to 0.8 microns; and in which said polycrystalline $Pb_5Ge_3O_{11}$ phase film has a c-axis crystallographic orientation, whereby the c-axis orientation promotes ferroelectric film properties.

2. A PGO film as in claim 1 in which said polycrystalline $Pb_5Ge_3O_{11}$ phase film includes crystals grains having a deviation in grain size uniformity of less than 10%.

3. A PGO film as in claim 1 in which approximately 70%, or more, of said polycrystalline $Pb_5Ge_3O_{11}$ phase film has the c-axis orientation.

4. A lead germanium oxide (PGO) film having improved ferroelectric properties comprising:

a polycrystalline $Pb_5Ge_3O_{11}$ phase film overlying a platinum metal layer; and in which approximately 70%, or more, of said polycrystalline $Pb_5Ge_3O_{11}$ phase film has a c-axis orientation.

5. A PGO film as in claim 4 in which said polycrystalline $Pb_5Ge_3O_{11}$ phase film includes crystal grains having a grain size in the range of approximately 0.2 to 0.8 microns.

6. A PGO film as in claim 5 in which said polycrystalline $Pb_5Ge_3O_{11}$ phase film includes crystals grains having a deviation in grain size uniformity of less than 10%.

* * * * *